(12) United States Patent
Tokuda (10) Patent No.: US 10,026,920 B2
(45) Date of Patent: Jul. 17, 2018

(54) ORGANIC EL DISPLAY DEVICE

(71) Applicant: Japan Display Inc., Minato-ku (JP)

(72) Inventor: Naoki Tokuda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/724,434

(22) Filed: Oct. 4, 2017

(65) Prior Publication Data
US 2018/0102497 A1   Apr. 12, 2018

(30) Foreign Application Priority Data

Oct. 7, 2016   (JP) .................................. 2016-199034

(51) Int. Cl.
| | | |
|---|---|---|
| H01L 29/08 | (2006.01) | |
| H01L 35/24 | (2006.01) | |
| H01L 51/52 | (2006.01) | |
| H01L 27/32 | (2006.01) | |

(52) U.S. Cl.
CPC ...... *H01L 51/5212* (2013.01); *H01L 27/3262* (2013.01); *H01L 27/3265* (2013.01); *H01L 27/3276* (2013.01); *H01L 51/5209* (2013.01)

(58) Field of Classification Search
CPC ....................... H01L 27/3244; H01L 51/5212
USPC ..................................................... 257/40, 59
See application file for complete search history.

(56) References Cited

U.S. PATENT DOCUMENTS

| | | | |
|---|---|---|---|
| 6,821,655 B1 | 11/2004 | Ohta et al. | |
| 8,344,388 B2 * | 1/2013 | Asano ................. | G09G 3/3233 257/59 |
| 2008/0309233 A1* | 12/2008 | Hasegawa ........... | H01L 27/3244 313/505 |
| 2010/0133988 A1* | 6/2010 | Kim .................... | H01L 27/3276 313/504 |
| 2010/0271354 A1* | 10/2010 | Yamashita ........... | G09G 3/3233 345/206 |
| 2012/0175645 A1* | 7/2012 | Omoto ................. | G09G 3/3233 257/88 |
| 2012/0286275 A1* | 11/2012 | Tatara ................. | H01L 27/1255 257/59 |

(Continued)

FOREIGN PATENT DOCUMENTS

| | | |
|---|---|---|
| JP | 2001-089846 | 4/2001 |
| JP | 2003-048752 | 2/2003 |

*Primary Examiner* — Lex Malsawma
*Assistant Examiner* — Eric W Jones
(74) *Attorney, Agent, or Firm* — Oblon, McClelland, Maier & Neustadt, L.L.P.

(57) ABSTRACT

An organic EL display device includes a substrate on which a plurality of driver transistors are formed, a first wiring that supplies an electric voltage in accordance with a display image via one of the driver transistors, an organic EL film that emits light, an anode electrode, and an auxiliary electrode film including a first low resistance part, a second low resistance part separated from the first low resistance part, and a high resistance part disposed between the first low resistance part and the second low resistance part. The first low resistance part is electrically connected to the first wiring and the anode electrode. The second low resistance part forms an electrostatic capacitance between the anode electrode and itself. The high resistance part has an electric resistance higher than those of the first low resistance part and the second low resistance part.

5 Claims, 8 Drawing Sheets

(56) References Cited

U.S. PATENT DOCUMENTS

| | | | |
|---|---|---|---|
| 2014/0111404 A1* | 4/2014 | Omata | H05B 33/08 |
| | | | 345/76 |
| 2014/0159019 A1* | 6/2014 | Jung | H01L 27/3265 |
| | | | 257/40 |
| 2016/0126304 A1* | 5/2016 | Cho | H01L 27/3276 |
| | | | 257/40 |
| 2017/0117302 A1* | 4/2017 | Zhang | H01L 27/1225 |

* cited by examiner

ORGANIC EL DISPLAY DEVICE

CROSS-REFERENCE TO RELATED APPLICATION

The present application claims priority from the Japanese Application JP2016-199034 filed on Oct. 7, 2016, the content of which is hereby incorporated by reference into this application.

BACKGROUND OF THE INVENTION

1. Field of the Invention

One or more embodiments of the present invention relate to an organic EL display device.

2. Description of the Related Art

Recent years, research and development of quality enhancement and manufacturing cost reduction of an organic EL display device is proceeded. An organic EL display device displays an image by a plurality of pixels in which an electric circuit is formed. Since the electric circuit includes a plurality of electrodes, capacitors and the like to which signals are supplied, for the quality enhancement and the manufacturing cost reduction as above, technological development for a film constituting electrodes and capacitors is important.

For example, Japanese Patent Application Laid-Open No. 2003-048752 discloses a manufacturing method of an ITO film with a uniform electric resistance obtained by a formation of film containing Tin as much as 10-40% of the amount of Indium by weight, and further the heat processing in the atmosphere containing Oxygen at a temperature of 200° C. or higher.

Further, for example, Japanese Patent Application Laid-Open No. 2001-089846 discloses a manufacturing method of an ITO film with a low electric resistance to heat the substrate through laser irradiation and deposit an ITO film on the crystalline substrate at a substrate temperature of 500-1000° C.

SUMMARY OF THE INVENTION

Since different signals are respectively provided to the electrodes included in the pixels, the films to which the different signals are provided need to be electrically separated. Further, in order to reduce the manufacturing cost, it is preferable to reduce the number of manufacturing processes. Therefore if a plurality of electrically separated films can be formed in a single film formation process, the manufacturing cost can be reduced.

According to Japanese Patent Application Laid-Open No. 2003-048752 and Japanese Patent Application Laid-Open No. 2001-089846 mentioned above, an ITO film with a uniform electric resistance and an ITO film with a low electric resistance can be formed. However, a plurality of electrically separated films cannot be formed by merely irradiating laser. Accordingly, in the case where different signals are supplied to films formed in the same process, films that are physically separated from one another need to be formed.

Figure 7A:
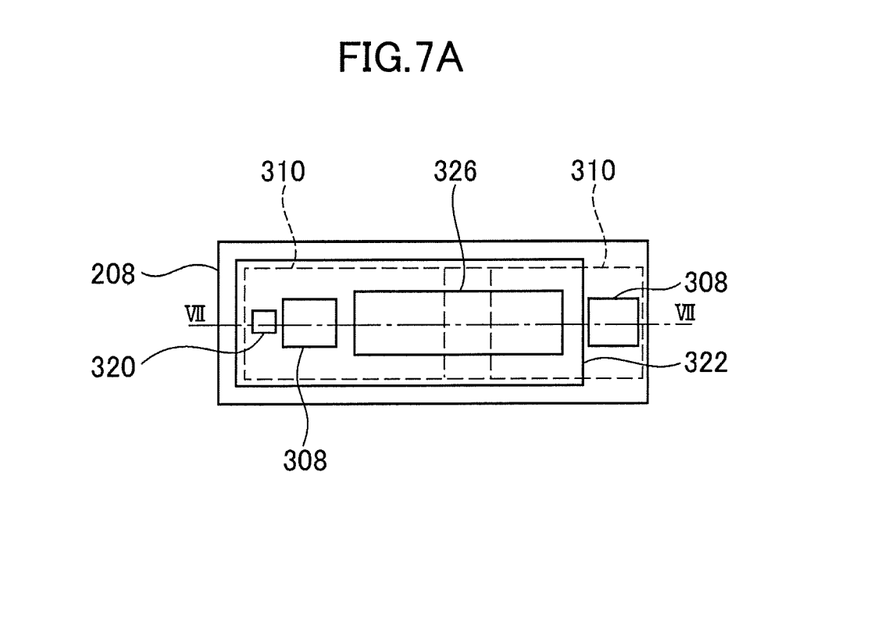
FIG. 7A is a diagram for illustrating a case where an auxiliary electrode film is physically divided in the prior art.

For example, FIG. 7A is a planar diagram of a pixel 208 including auxiliary electrode films 310 that are formed in the same process by physically dividing the auxiliary electrode film 310, and are configured so that different signals can be supplied thereto in a pixel configuration of the prior art. Further, FIG. 7B is a diagram illustrating VII-VII cross section in FIG. 7A.

Figure 7B:
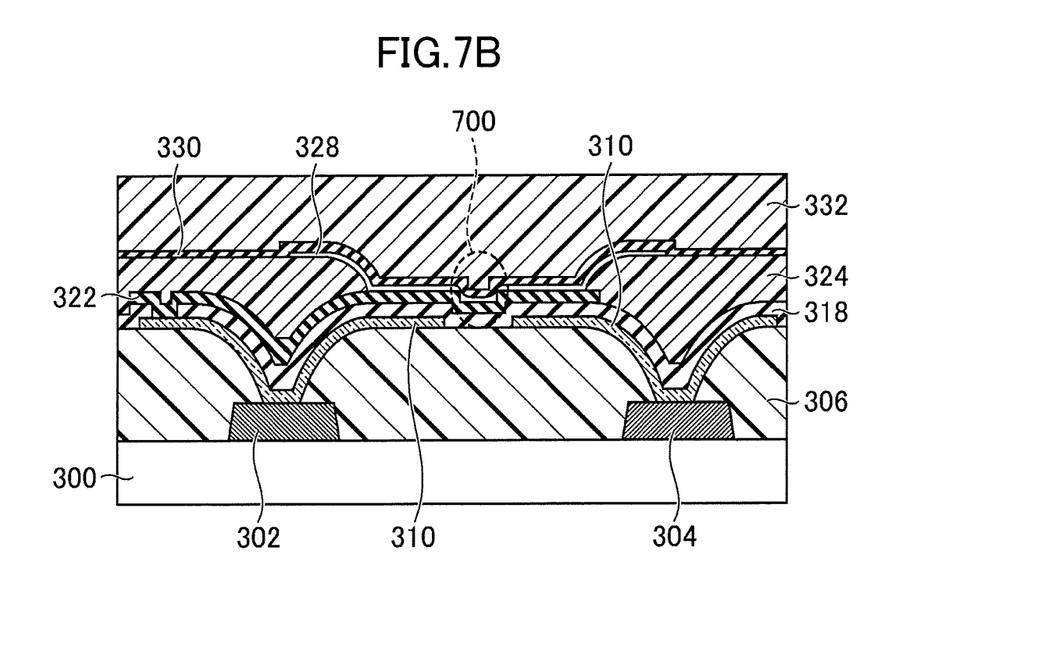
FIG. 7B is a diagram for illustrating a case where an auxiliary electrode film is physically divided in the prior art.

As illustrated in FIGS. 7A and 7B, a display panel 200 is configured to include a first wiring 302, a second wiring 304, the auxiliary electrode film 310, an anode electrode 322, an organic EL film 328, a cathode electrode 330, and the like. Further, the auxiliary electrode film 310 is physically divided on the top of a planarizing film 306 so that different signals can be supplied thereto from the first wiring 302 and the second wiring 304.

Since the auxiliary electrode films 310 are physically separated, the anode electrode 322 and the cathode electrode 330 formed over the auxiliary electrode film 310 have steps at the part where the auxiliary films 310 are separated. The organic EL film 328 formed between the anode electrode 322 and the cathode electrode 330 is thin, and there is a fear that the anode electrode 322 and the cathode electrode 330 are short-circuited in a region 700 where there are the steps. If the anode electrode 322 and the cathode electrode 330 are short-circuited, the organic EL film 328 formed between the anode electrode 322 and the cathode electrode 330 does not emit light, which causes a display defect.

Figure 8A:
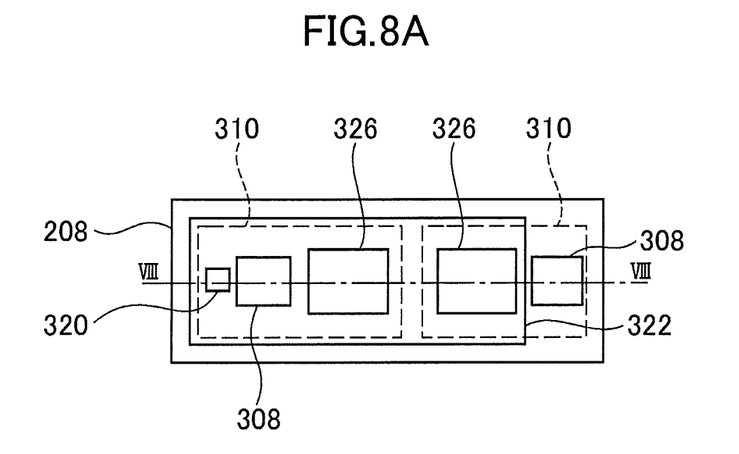
FIG. 8A is a diagram for illustrating a case where a rib is formed at a part where the auxiliary electrode film is divided.
Figure 8B:
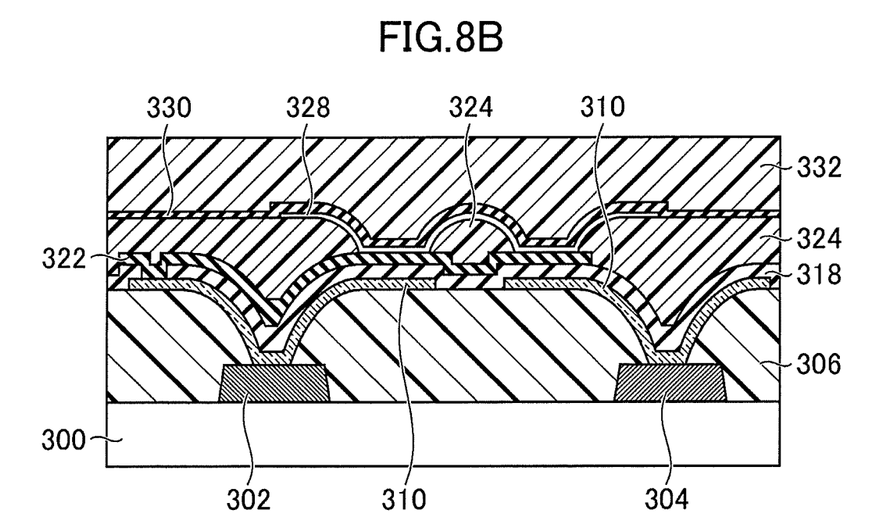
FIG. 8B is a diagram for illustrating a case where a rib is formed at a part where the auxiliary electrode film is divided.

Then, as the configuration illustrated in FIGS. 7A and 7B, a configuration is possible where a rib 324 is formed between the anode electrode 322 and the organic EL film 328. FIG. 8A is a planar diagram of the pixel 208 of the case where the rib 324 is formed between the anode electrode 322 and the organic EL film 328. Further, FIG. 8B is a diagram illustrating VIII-VIII cross section in FIG. 8A.

However, according to this configuration, an area of a rib opening part 326 becomes small due to the rib 324, and the light emitting area per one pixel 208 becomes small. Thus, the display quality deteriorates due to this configuration. Further, if a large current is supplied to the organic EL film 328 so as to compensate the decrease in the light emitting area, the life span of the organic EL film 328 becomes shorter.

The present invention has been made in view of the above problems, and the object thereof is to provide an organic EL display device, which is manufactured in a small number of manufacturing processes, and has a high display quality and a long life span.

According to one aspect of the present invention, an organic EL display device includes a substrate on which a plurality of driver transistors are formed, a first wiring that supplies an electric voltage in accordance with a display image via one of the driver transistors, an organic EL film that emits light of a luminance in accordance with the electric voltage, an anode electrode formed under the organic EL film, and an auxiliary electrode film including a first low resistance part, a second low resistance part separated from the first low resistance part, and a high resistance part disposed between the first low resistance part and the second low resistance part. The first low resistance part is electrically connected to the first wiring and the anode electrode. The second low resistance part forms an electrostatic capacitance between the anode electrode and itself. The high resistance part has an electric resistance higher than those of the first low resistance part and the second low resistance part.

In one embodiment of the present invention, the second low resistance part is electrically connected to a gate terminal of the one of the driver transistors.

In one embodiment of the present invention, the organic EL display device further includes a second wiring to which a GND electric voltage is applied. The second low resistance part is electrically connected to the second wiring.

In one embodiment of the present invention, the organic EL display device further includes a rib on the anode electrode. The rib has an opening part over the high resistance part.

In one embodiment of the present invention, the high resistance part is formed of material containing oxygen molecules fewer than those contained in the first low resistance part and the second low resistance part.

DETAILED DESCRIPTION OF THE INVENTION

Below, respective embodiments of the present invention are explained with reference to the accompanying drawings. Note that disclosed embodiments are merely examples, and an appropriate variation that a person skilled in the art can easily arrive at without departing from the spirit of the present invention is naturally included in the scope of the present invention. Further, while the width, thickness, shape, and the like of each part in the drawings may be illustrated schematically as compared with actual embodiments in order to clarify the explanation, these are merely examples and an interpretation of the present invention should not be limited thereto. Furthermore, in the specification and respective drawings, the same reference symbols may be applied to elements similar to those that have already been illustrated in another drawing and a detailed explanation of such elements may be omitted as appropriate.

Figure 1:
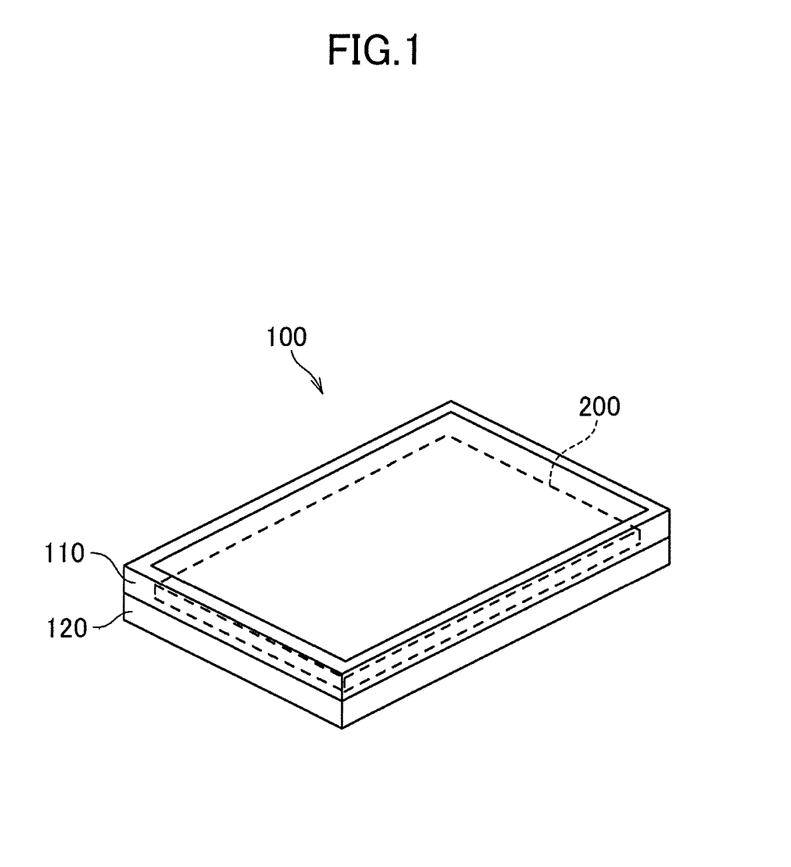
FIG. 1 is a diagram that schematically illustrates a display device according to an embodiment of the present invention.

FIG. 1 is a diagram that schematically illustrates an organic EL display device 100 according to an embodiment of the present invention. As illustrated in the figure, the organic EL display device 100 is composed of a display panel 200 that is fixed so as to be sandwiched by an upper frame 110 and a lower frame 120.

Figure 2:
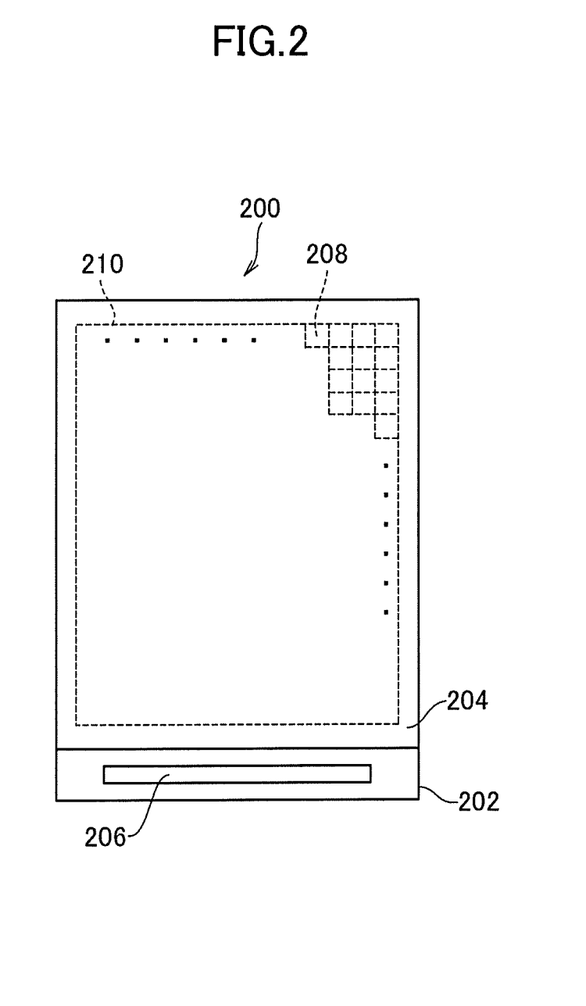
FIG. 2 is a diagram that schematically illustrates a display panel.

FIG. 2 is a schematic diagram that illustrates the configuration of the display panel 200 of FIG. 1. As illustrated in FIG. 2, the display panel 200 includes an array substrate 202, a protection film 204, and a driver IC (Integrated Circuit) 206. Further, the organic EL display device 100 includes a display region 210 made up of a plurality of pixels 208. The plurality of pixels 208 will be described later. On the array substrate 202, an organic EL film 328, a sealing film 332 that prevent impurities from intruding into the organic EL film 328, and the like to be described later are formed.

The driver IC 206, for example, supplies an electric voltage to conduct a source and a drain and an electric current corresponding to a gradation value, to a driver transistor 414 (to be described later) disposed in each of the subpixel. By the driver IC 206, the display panel 200 displays an image in accordance with image signals input to the organic EL display device 100, on the display region 210.

The protection film 204 is an acrylic film to protect the display panel 200 from external damages, and is bonded to the array substrate 202 by adhesive.

Figure 3A:
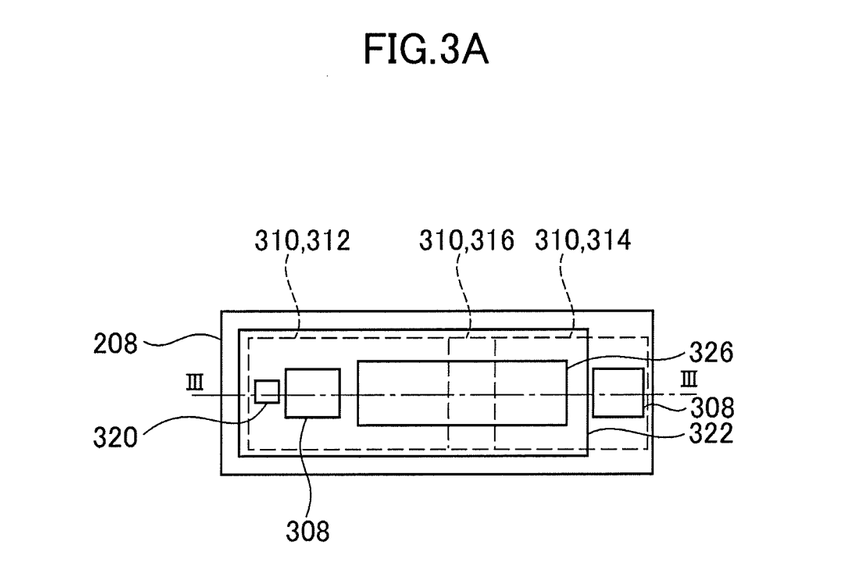
FIG. 3A is a diagram for illustrating a pixel.

Subsequently, details of the pixel 208 are explained. FIG. 3A is a diagram illustrating a magnified view of one pixel 208 in FIG. 2, and FIG. 3B is a diagram illustrating III-III cross section of FIG. 3A.

Figure 3B:
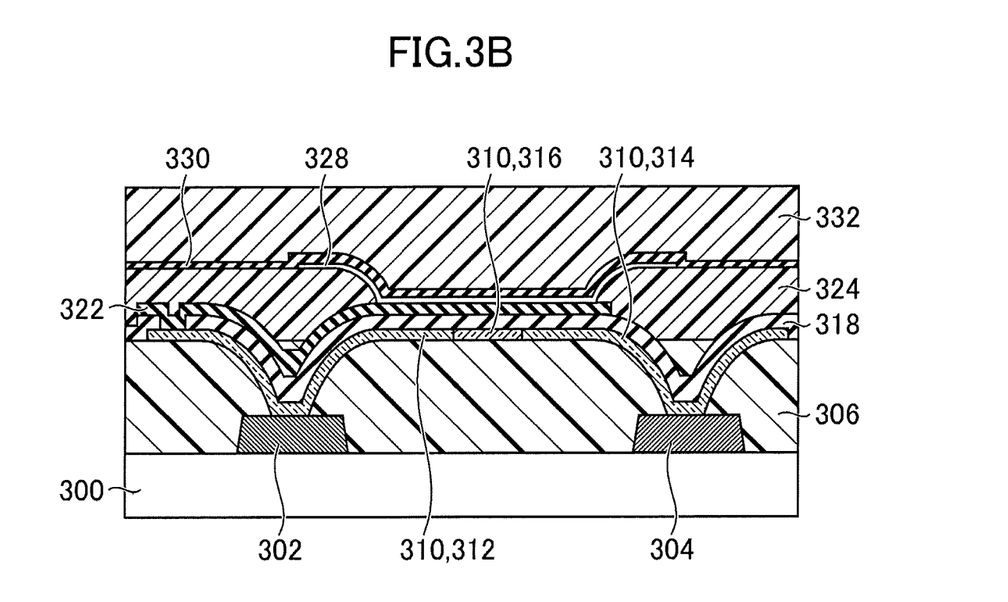
FIG. 3B is a diagram for illustrating a pixel.

As illustrated in FIG. 3B, the display panel 200 includes an array layer 300 formed on a substrate (not illustrated), the first wiring 302, the second wiring 304, the planarizing film 306, the auxiliary electrode film 310, an interlayer insulating film 318, the anode electrode 322, the rib 324, the organic EL film 328, the cathode electrode 330, and the sealing film 332.

On the array layer 300, a plurality of driver transistors 414 (see FIG. 4) are formed. Specifically, the array layer 300 is formed on a substrate that is formed of resin and has flexibility, or on a glass substrate. The array layer 300 is formed so as to include the plurality of driver transistors 414 configured to include the source electrode, the drain electrode, the gate electrode, a semiconductor layer, and the like. Further, the array layer 300 is formed to include the driver transistor 414 (see FIG. 4) that controls an electric current to be supplied to the organic EL film 328.

The first wiring 302 supplies an electric voltage in accordance with a display image via the driver transistor 414. Specifically, the first wiring 302 is formed on the array electrode 300 to be electrically connected to the source electrode or the drain electrode of the driver transistor 414 formed in the array electrode 300. The first wiring 302 supplies an electric voltage in accordance with a display image via the driver transistor 414 to a first low resistance part 312 of the auxiliary electrode film 310 to be described later.

The second wiring 304 is formed so as to be electrically connected to the auxiliary electrode film 310. Specifically, the second wiring 304 is formed on the array electrode 300 so as to be electrically connected to a second low resistance part 314 of the auxiliary electrode film 310 to be described later.

Further, to the second wiring 304, a constant electric voltage is supplied at least when a timing control transistor 404 is in the OFF state. For example, the second wiring 304 is electrically connected to the gate terminal of the driver transistor 414 and an electric potential of the first wiring 302 is supplied to the second wiring 304. Further, to the second wiring 304, a GND electric voltage may be applied from the outside of the display panel 200.

The planarizing film 306 is formed on the array layer 300, the first wiring 302, and the second wiring 304. Specifically, the planarizing film 306 is formed of an insulating material so as to have a planarizing film opening part 308 on the top of the first wiring 302 and the top of the second wiring 304 and so as to cover the array layer 300 of the region where the first wiring 302 and the second wiring 304 are not formed.

The auxiliary electrode film 310 is configured to include the first low resistance part 312, the second low resistance part 314 that is separated from the first low resistance part 312, and a high resistance part 316 disposed between the first low resistance part 312 and the second low resistance part 314. Specifically, the auxiliary electrode film 310 includes the first low resistance part 312 that is electrically connected to the first wiring 302 via the rib opening part 326, and is electrically connected to the anode electrode 322 via the insulating film opening part 320. The first low resistance part 312 is, for example, formed of ITO, and is formed such that its electric resistance is lower than that of the high resistance part 316 by three digits. Further, the first low resistance part 312 is formed, as illustrated in FIG. 3A, so as to be extended over the insulating film opening part 320, the planarizing film opening part 308, and the rib opening part 326, to be described later.

Moreover, the auxiliary electrode film 310 includes the second low resistance part 314 that is electrically connected to the second wiring 304 via the rib opening part 326. The second low resistance part 314 is formed of, for example, ITO, as the first low resistance part 312, and is formed to have an electric resistance that is lower than that of the high resistance part 316 by three digits. Further, the second low resistance part 314 is formed to be electrically separated from the first low resistance part 312 by the high resistance part 316. Further, the second wiring 304 is electrically connected to the gate terminal of the driver transistor 414, and the same electric voltage as that of the gate terminal of the driver transistor 414 is applied to the second wiring 304. Therefore, the second low resistance part 314 forms an electrostatic capacitance between the anode electrode 322 and itself. Further, the second low resistance part 314 is, as illustrated in FIG. 3A, formed at a position that overlaps with the rib opening part 326 and the planarizing film opening part 308.

Further, the auxiliary electrode film 310 includes the high resistance part 316 that physically contacts the first low resistance part 312 and the second low resistance part 314 in the layer where the first low resistance part 312 and the second low resistance part 314 exist. The high resistance part 316 is formed of a material that contains oxygen molecules less than the first low resistance part 312 and the second low resistance part 314 do, and is formed to have an electric resistance higher than those of the first low resistance part 312 and the second low resistance part 314. Further, the high resistance part 316 is, as illustrated in FIG. 3A, formed at a position that overlaps with the rib opening part 326.

The interlayer insulating film 318 is formed on the auxiliary electrode film 310 and the planarizing film 306. Specifically, the interlayer insulating film 318 includes the insulating film opening part 320 at the left edge part of the first low resistance part 312, and is formed of an insulating material so as to cover the auxiliary electrode film 310 and the planarizing film 306 in the region where no insulating film opening part 320 is formed.

The anode electrode 322 is formed under the organic EL film 328. Specifically, the anode electrode 322 is formed, on the interlayer insulating film 318, of a material having transmissivity and conductivity and is electrically connected to the first low resistance part 312 through the insulating film opening part 320. Further, the anode electrode 322 is formed so as to overlap, in a planar view, with the second low resistance part 314 on the top of the planarizing film 306, to thereby form an electrostatic capacitance between the second low resistance part 314 and itself.

The rib 324 is formed on the anode electrode 322. Specifically, the rib 324 is formed on the anode electrode 322 so as to cover the interlayer insulating film 318. Further, the rib 324 is formed to have the rib opening part 326 over the first low resistance part 312, the high resistance part 316, and the second low resistance part 314 on the top of the planarizing film 306. The rib opening part 326 is a region out of which light from the display panel 200 exits.

The organic EL film 328 emits light with a luminance in accordance with the electric voltage. Specifically, the organic EL film 328 is formed on the edge of the rib 324 and on the anode electrode 322 in the rib opening part 326. Note that the organic EL film 328 is formed to include a hole injection layer, a hole transport layer, a light emitting layer, an electron injection layer, an electron transport layer, and the like, but detailed explanations thereof are not given because it is similar to that of the prior art.

The cathode electrode 330 is formed on the organic EL film 328. Specifically, the cathode electrode 330 is formed of a material having light transmissivity and conductivity so as to cover the organic EL film 328 and the rib 324. The cathode electrode 330 supplies electrons to the organic EL film 328 to thereby have, together with holes supplied to the organic EL film 328 from the anode electrode 322, the organic EL film 328 emit light.

The sealing film 332 is formed on the cathode electrode 330. Specifically, the sealing film 332 is formed of an inorganic material which does not let moisture go through, so as to cover the cathode electrode 330. The sealing film 332 prevents the deterioration of the organic EL film 328 due to the infiltration of moisture into the organic EL film 328.

According to the above configuration, the decrease in the light emitting area due to the rib 324 can be prevented, and thus the decrease of the luminance can be prevented. Further, by reducing the amount of an electric current that runs in the organic EL film 328 per one pixel, the life span of the organic EL film 328 can be extended. Further, by forming the first low resistance part 312, the high resistance part 316, and the second low resistance part 314 in the same layer, the manufacturing can be completed in fewer manufacturing processes according to the manufacturing method to be described later.

Figure 4:
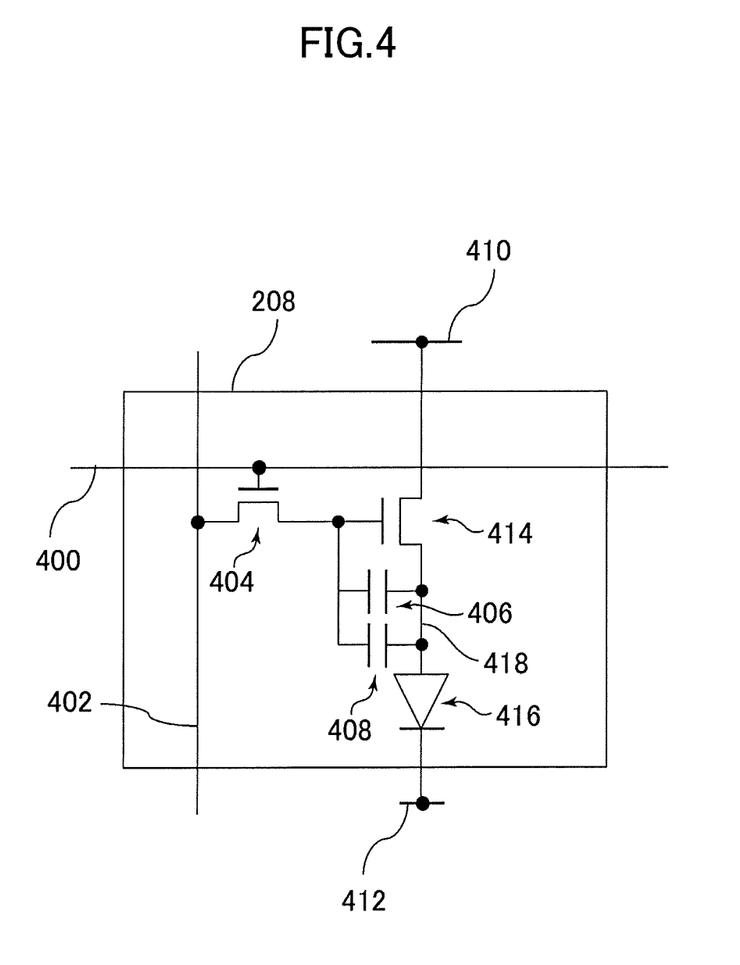
FIG. 4 is a diagram for illustrating a pixel circuit.

Subsequently, the pixel circuit formed in the pixel 208 is explained. FIG. 4 is an example that schematically illustrates the pixel circuit formed in one pixel 208 in the embodiment of the present invention. As illustrated in FIG. 4, the pixel circuit is configured to include a gate signal line 400, an image signal line 402, a timing control transistor 404, a first capacitor 406, a second capacitor 408, an electric power source 410, a cathode wiring 412, a driver transistor 414, an organic EL element 416, and an anode wiring 418.

The gate signal line 400 is connected to the gate terminal of the timing control transistor 404. Specifically the gate signal line 400 supplies a gate signal supplied from the driver IC 206 for switching the timing control transistor 404 between the ON state and the OFF state to the gate terminal of the timing control transistor 404.

The image signal line 402 is connected to one of the source terminal and the drain terminal of the timing control transistor 404. Specifically, the image signal line 402 supplies an electric voltage in accordance with an image signal supplied from the driver IC 206 to one of the source terminal and the drain terminal of the timing control transistor 404.

The timing control transistor 404 controls the timing at which an electric current is applied to the organic EL element 416. Specifically, the timing control transistor 404 conducts the source terminal and the drain terminal of the timing control transistor 404 with the voltage applied to the gate terminal in either of a high state or a low state. The timing control transistor 404 supplies, in accordance with the state of a gate signal supplied to the gate terminal, an electric voltage of the image signal line 402 to the first capacitor 406 and the second capacitor 408, to thereby controls the timing to apply an electric current to the organic EL element 416.

The first capacitor 406 and the second capacitor 408 maintain the electric voltage supplied from the image signal line 402. Specifically, the first capacitor 406 and the second capacitor 408 are at the same electric potential as the electric potential of the image signal line 402, at the timing where the timing control transistor 404 is in the ON state. After that, by the gate signal, the timing control transistor 404 is in a state where the source terminal and the drain terminal are electrically disconnected from each other. The first capacitor 406 and the second capacitor 408 are in a floating state until the timing control transistor 404 is turned to the ON state next time, and maintain the electric voltage supplied from the image signal line 402.

The first capacitor 406 is a capacitor used in the prior art, and therefore detailed explanations thereof are not given hear. Whereas, the second capacitor 408 is an electrostatic capacitance formed between the anode electrode 322 and the second low resistance part 314 illustrated in FIG. 3. Therefore, according to the present invention, since the second capacitor 408 additionally exists as compared with the prior art, the capacitance of the capacitor to maintain the electric voltage of the anode terminal of the organic EL element 416 can be increased. By increasing the capacitance of the capacitor, the decrease in the light emitting amount of the organic EL element 416 during one frame period can be moderated.

The electric power source 410 is connected to the driver transistor 414, and supplies the organic EL element 416 with an electric current via the anode wiring 418. Specifically, the electric power source 410 is electrically connected to the source terminal or the drain terminal of the driver transistor 414. To the electric power source 410, a constant electric voltage is applied, and therefore when the driver transistor 414 is in the ON state, the electric power source 410 supplies the organic EL element 416 with an electric current.

The cathode wiring 412 is electrically connected to the organic EL element 416. Specifically, the cathode wiring 412 is electrically connected to the cathode terminal of the organic EL element 416, and an electric voltage is applied between the cathode wiring 412 and the electric power source 410, to thereby have the organic EL element 416 emit light. Note that the cathode wiring 412 is electrically connected to the cathode electrode 330 in FIG. 3.

The driver transistor 414 is connected to the timing control transistor 404, the first capacitor 406, the second capacitor 408, the electric power source 410, and the anode wiring 418. Specifically, the gate terminal of the driver transistor 414 is electrically connected to the source terminal or the drain terminal of the timing control transistor 404, the first capacitor 406, and the second capacitor 408. One of the source terminal and the drain terminal of the driver transistor 414 is electrically connected to the electric power source 410. Further, the other one of the source terminal and the drain terminal of the driver transistor 414 is electrically connected to the first capacitor 406, the second capacitor 408, and the anode wiring 418.

The driver transistor 414 supplies an electric current to the organic EL element 416 through the anode wiring 418. Specifically, the driver transistor 414 supplies, in accordance with the electric voltage maintained in the first capacitor 406 and the second capacitor 408, an electric current supplied from the electric power source 410 to the organic EL element 416.

The organic EL element 416 emits light by the electric current supplied from the electric power source 410. Specifically, to the organic EL element 416 the electric current in accordance with the electric voltage maintained in the first capacitor 406 and the second capacitor 408 is supplied by the driver transistor 414. Note that the organic EL element 416 is constituted by the organic EL film 328 in FIG. 3.

The anode wiring 418 is electrically connected to the driver transistor 414, the first capacitor 406, the second capacitor 408, and the organic EL element 416. Specifically, the anode wiring 418 is connected to the source terminal or the drain terminal of the driver transistor 414, and the organic EL element 416, and supplies an electric current supplied from the electric power source 410 to the organic EL element 416. Further, the anode wiring 418 is electrically connected to the anode electrode 322 illustrated in FIG. 3, and an electrostatic capacitance is formed between the anode wiring 418 and a wiring electrically connected to the gate terminal of the driver transistor 414. Specifically, as illustrated in FIG. 3, in the case where the second wiring 304 is electrically connected to the gate terminal of the driver transistor 414, the electrostatic capacitance is formed between the anode electrode 322 and the second low resistance part 314 electrically connected to the gate terminal of the driver transistor 414.

According to the present invention, as described above, the electrostatic capacitance of the capacitor can be increased by forming an electrostatic capacitance between the anode wiring 418 and the second low resistance part 314, and thus the decrease in the light emitting amount of the organic EL element 416 during one frame period can be moderated.

Figure 5:
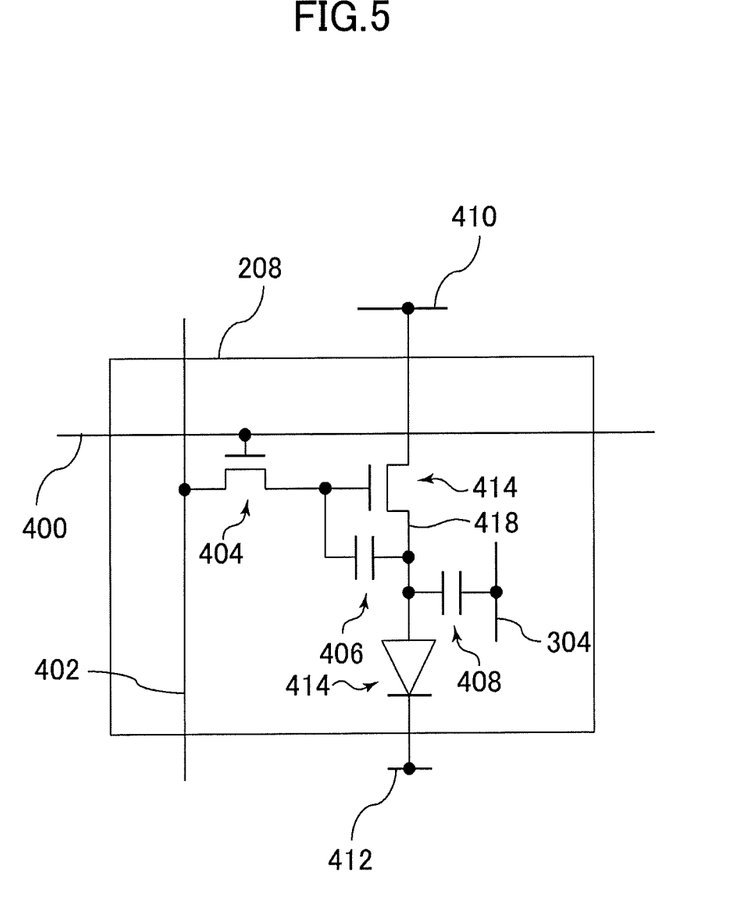
FIG. 5 is a diagram for illustrating a variation of the pixel circuit.

The wiring that forms the electrostatic capacitance between the anode wiring 418 and itself is not limited to the wiring connected to the gate terminal of the driver transistor 414. For example, as illustrated in FIG. 5, the second capacitor 408 may be an electrostatic capacitance formed between the anode wiring 418 and the second wiring 304 to which the GND electric voltage is applied from the outside of the display panel 200. Further, it is sufficient if a constant electric voltage is supplied to the second wiring 304 at least when the timing control transistor 404 is in the OFF state, and the electric voltage does not have to be the GND electric voltage.

Figure 6A:
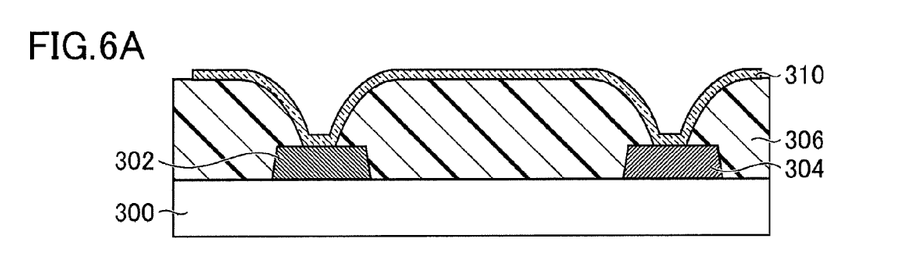
FIG. 6A is a diagram for illustrating a manufacturing process of the present invention.

Subsequently, a manufacturing method of the organic EL display device 100 as above is explained with reference to FIG. 6. Firstly, as illustrated in FIG. 6A, the array layer 300, the first wiring 302, and the second wiring 304 are formed in order on the substrate. Next, so as to cover the array layer 300, the first wiring 302, and the second wiring 304, the planarizing film 306 is formed, and the planarizing film opening part 308 is formed right above the first wiring 302 and the second wiring 304.

Next, over the array layer 300, the first wiring 302, and the second wiring 304, the auxiliary electrode film 310 is formed. Specifically, the auxiliary electrode film 310 is formed so that it contacts the first wiring 302 and the second wiring 304 at the planarizing film opening part 308, and so that it has no gap on the top part of the planarizing film 306 formed between the first wiring 302 and the second wiring 304.

Figure 6B:
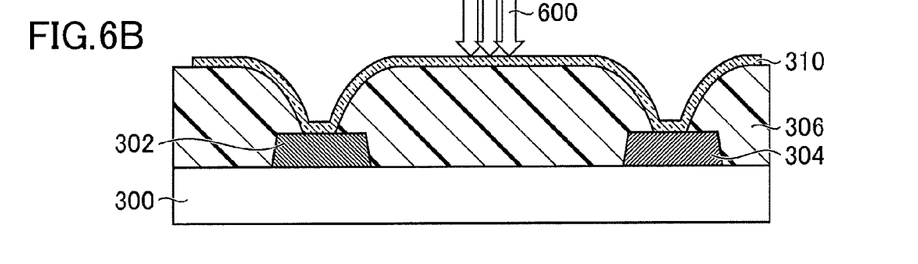
FIG. 6B is a diagram for illustrating a manufacturing process of the present invention.

Subsequently, as illustrated in FIG. 6B, laser 600 is irradiated onto the auxiliary electrode film 310 on the top part of the planarizing film 306 formed between the first wiring 302 and the second wiring 304. Specifically, for example, in the case where the auxiliary electrode film 310 is formed of ITO, the laser 600 having the energy with which oxygen molecules are removed is irradiated onto the auxiliary electrode film 310 at the central part where the rib opening part 326 is formed.

Figure 6C:
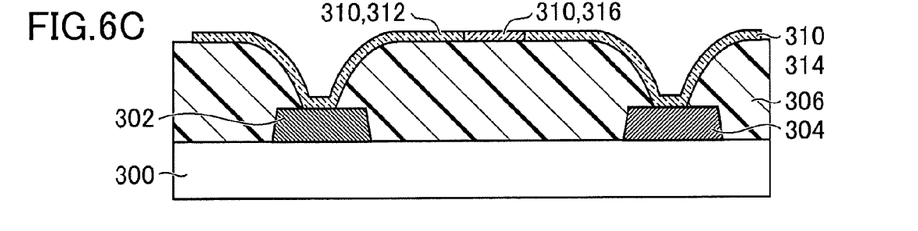
FIG. 6C is a diagram for illustrating a manufacturing process of the present invention.

When the laser 600 is irradiated, as illustrated in FIG. 6C, the region onto which the laser 600 is irradiated has a higher resistance due to the loss of oxygen molecules, and that region becomes the high resistance part 316. Further, as for the parts of the auxiliary electrode film 310 divided by the high resistance part 316, the region connected to the first wiring 302 becomes the first low resistance part 312, and the region connected to the second wiring 304 becomes the second low resistance part 314.

Figure 6D:
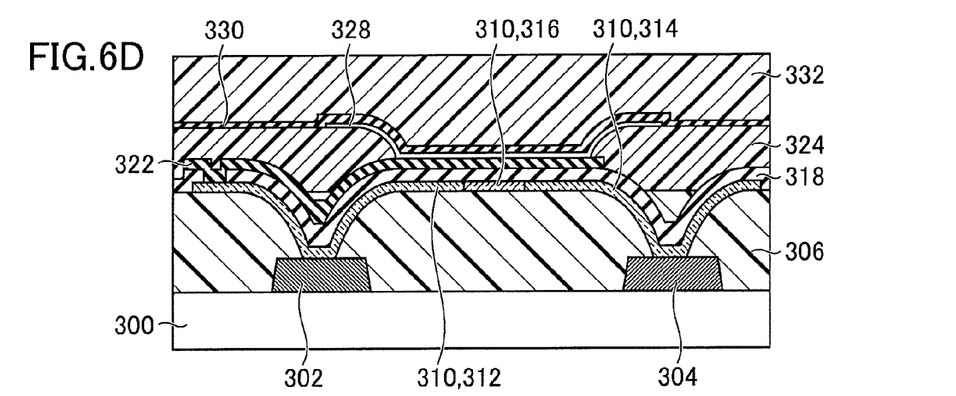
FIG. 6D is a diagram for illustrating a manufacturing process of the present invention.

Subsequently, as illustrated in FIG. 6D, the interlayer insulating film 318, the insulating film opening part 320, the anode electrode 322, the rib 324, the rib opening part 326, the organic EL film 328, the cathode electrode 330, and the sealing film 332 are formed in order. This process is similar to those of the prior art, and detailed explanations thereof are not given.

As above, by a single laser irradiation, the first low resistance part 312, the second low resistance part 314, and the high resistance part 316 can be formed in the auxiliary electrode film formed in a single process. Thus a plurality of electrically separated films can be formed in a small number of processes as compared with the prior art.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic EL display device comprising:
   a substrate on which a plurality of driver transistors are formed;
   a first wiring that supplies an electric voltage in accordance with a display image via one of the driver transistors;
   an organic EL film that emits light of a luminance in accordance with the electric voltage;
   an anode electrode formed under the organic EL film; and
   an auxiliary electrode film including a first low resistance part, a second low resistance part separated from the first low resistance part, and a high resistance part disposed between the first low resistance part and the second low resistance part,
   wherein the first low resistance part is electrically connected to the first wiring and the anode electrode,
   the second low resistance part forms an electrostatic capacitance between the anode electrode and itself, and
   the high resistance part has an electric resistance higher than those of the first low resistance part and the second low resistance part.

2. The organic EL display device according to claim 1, wherein the second low resistance part is electrically connected to a gate terminal of the one of the driver transistors.

3. The organic EL display device according to claim 1, further comprising a second wiring to which a GND electric voltage is applied,
   wherein the second low resistance part is electrically connected to the second wiring.

4. The organic EL display device according to claim 1, further comprising a rib on the anode electrode,
   wherein the rib has an opening part over the high resistance part.

5. The organic EL display device according to claim 1, wherein the high resistance part is formed of a material containing oxygen molecules fewer than those contained in the first low resistance part and the second low resistance part.

* * * * *